United States Patent [19]

Le Mouellic et al.

[11] Patent Number: 4,646,263

[45] Date of Patent: Feb. 24, 1987

[54] READING AND/OR WRITING APPARATUS INCLUDING A REMOVABLE MEMORY-CONTAINING CASSETTE

[75] Inventors: Georges Le Mouellic, Sevres; Jean-Paul Brun, Argenteuil; Jean C. Gidrol, Fourqueux, all of France

[73] Assignee: Societe d'Applications Generales d'Electricite et de Mecanique Sagem, Paris, France

[21] Appl. No.: 627,975

[22] Filed: Jul. 5, 1984

[30] Foreign Application Priority Data

Jul. 7, 1983 [FR] France ................................ 83 11356

[51] Int. Cl.⁴ ........................ G11C 5/04; G11C 19/08
[52] U.S. Cl. ........................................................ 365/1
[58] Field of Search ........................................ 365/1, 2

[56] References Cited

U.S. PATENT DOCUMENTS 4,400,795  8/1983  Irie et al. .................................. 365/1
4,459,679  7/1984  Sukeda et al. ........................... 365/1

FOREIGN PATENT DOCUMENTS 0106474  4/1984  European Pat. Off. ................ 365/1

*Primary Examiner*—James W. Moffitt
*Attorney, Agent, or Firm*—Larson and Taylor

[57] ABSTRACT

System constituted by a reading and/or writing apparatus and a removable cassette for the latter, provided respectively with two couplable connector elements. The apparatus is equipped with a fixed guide member and a drive member mounted on a movable lever and both members are adapted to cooperate with a trough of the cassette to ensure rectilinear driving of the latter and correct cooperation of the two connector elements during the positioning or the extraction of the cassette.

9 Claims, 10 Drawing Figures

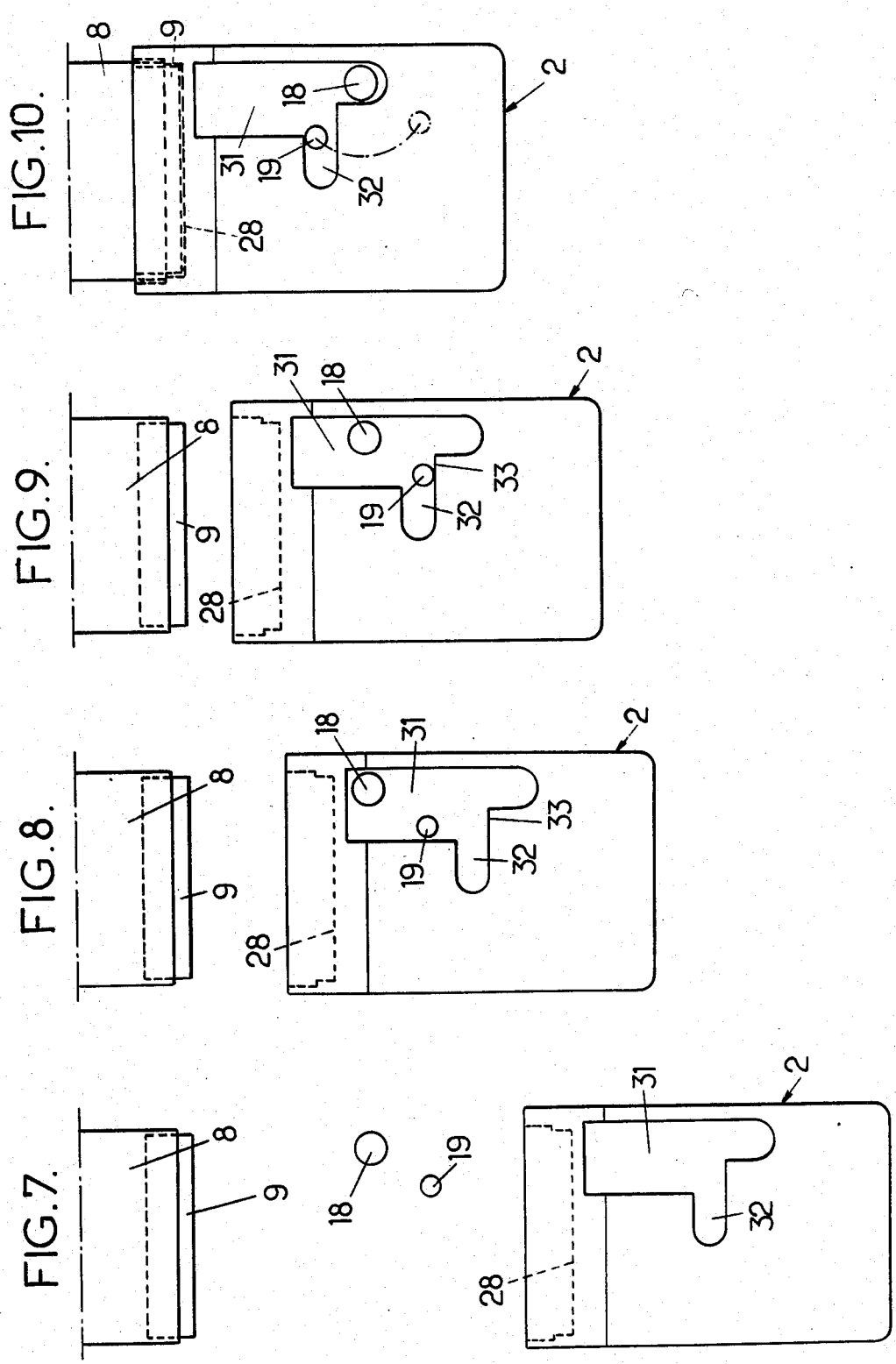

READING AND/OR WRITING APPARATUS INCLUDING A REMOVABLE MEMORY-CONTAINING CASSETTE

BACKGROUND OF THE INVENTION

The present invention relates to improvements in or to systems constituted by an apparatus, particularly for reading and/or writing, and by a removable cassette, particularly containing a memory, for such an apparatus, this apparatus comprising a housing to receive at least partially the cassette and two electrical connector elements provided with a plurality of contacts adapted to cooperate and provided respectively on the apparatus and the cassette.

Such an arrangement is, for example, used for bubble memories produced in the form of removable cassettes, the aforesaid connector elements serving to ensure the electrical connections between the cassette and the reading and/or writing apparatus. However, the presence of such a connector poses numerous problems if it is desired to ensure reliable connections between the cassette and the apparatus, to simplify to the maximum the process of insertion and extraction of the cassette and to avoid at any price the destruction of the contents of the memory.

These problems are due in particular to the relatively large number of contacts which the connector must have to ensure all the necessary connections between the cassette and the apparatus. Considerations of bulk, and of facility of manipulation and the quest for minimum cost lead to discarding special connectors with pins and sockets called nil insertion force. In the same way, the search for better reliability in the connections leads to putting aside connectors with contacts simply in abutment (such as the arrangement of the bubble memory cassette described in European Patent Application No. E-A-0045189, for example) and to rely essentially on connectors with so called pin and socket contacts. However, the large number necessary of such contacts involves considerable frictional forces between the pins and sockets in the course of the phases of connection and disconnection which, if these operations are effected manually, can lead the operator to effect cross movements which cause rapid destruction of the connector.

In addition, safety problems (for example connection or disconnection of certain which become offset over time) can render a manual insertion or extraction of the cassette very delicate, which is not always compatible with the other activities which must besides be ensured by the operator.

There is known for example (U.S. Pat. No. 3,784,954) a mechanical system for plugging in and unplugging two couplable connector elements for printed circuit cards. However this known mechanical system comprises two actuating members independent of one another and situated respectively at the two longitudinal ends of the connector. It is practically impossible for an operator with normal attention, to manipulate these two members with perfect synchronism; it is hence difficult to ensure, under normal conditions of use, that the movable element of the connector should follow a perfectly rectilinear path remaining strictly parallel to the fixed element of the connector. For this reason, it is not possible to ensure that the connection or disconnection of the various contacts will be effected in the desired sequence.

In addition, printed circuit cards equipped with such connectors have only in principle been placed in position or withdrawn under well-defined and few circumstances. The connectors and the associated actuating systems are hence only designed with a view to a restricted number of actuations, which make them quite unsuited for equipping such cassettes, like bubble memory cassettes, which must withstand without damage a very high number of insertions and extractions in a suitable cassette reader.

GENERAL DESCRIPTION OF THE INVENTION

It is therefore essentially an object of the invention to provide an arrangement for the cassette reader and the associated cassettes which does not present the above-indicated drawbacks.

Accordingly, there is provided, according to the invention, a system constituting an apparatus, particularly for reading and/or writing, and at least one removable cassette, particularly containing a memory, for such an apparatus, said apparatus comprising a housing for at least partially receiving the cassette and two electrical connector elements, including a plurality of cooperating contacts, provided respectively on the apparatus and on the cassette and being of pin and socket types respectively, said system comprising: (a) guide and drive means for guiding and driving the cassette in said housing, said guide and drive means comprising a trough provided on one surface of the cassette, said trough comprising a first, rectilinear trough portion extending in the direction of movement of the cassette and a second trough portion opening into said first, rectilinear trough portion and extending in the direction at an angle with respect to the latter, said guide and drive means further comprising a guide member and a drive member, projecting inside the housing, for cooperating respectively with said first and second trough portions, said guide and drive means being adapted to occupy at least a first, guide position in which the cassette can, without risk of jamming against the walls of the housing, be inserted partially into the housing or extracted from said housing when the cassette is only already partially withdrawn therefrom, and in which the two connector elements are not then respectively again, or any longer, in cooperation, and a second, locking position in which the cassette is inserted in and locked in the housing in an operational position with the two connector elements coupled to one another, and (b) a single actuating lever supporting said drive member and including one end which is actuable from outside the apparatus, said actuating lever extending partly into the housing and being movable in rotation, in a plane parallel to the surface of the housing bearing the said drive member and said guide member, around a fixed axis of rotation to cause the guide and drive means to move between the first and second positions thereof, said drive member being affixed to said actuating lever so as to possess at least one component of movement in the direction of the rectilinear movement of the cassette, due to which component of movement the movement of the cassette is effected in a rectilinear path such that the two connector elements are separated or brought together while being in a definite relative position, parallel to one another without the possibility of being mutually skewed.

Due to this arrangement, the movement of the cassette is effected along a pre-determined path such that the two connector elements are spaced or brought close to one another while being held in a definite relative position, preferably parallel to one another, without the possibility of mutually skewed positioning. As a result, the two connector elements are always correctly positioned with respect to one another and they only undergo normal wear. It is thus possible to use only connectors of conventional type with normal pin and socket contacts.

Moreover, the actuating lever can be arranged to play the role of force amplifier and provide the necessary force for the mechanical coupling of contacts of pin and socket type in large numbers, without the operator having to exert for his part excessive work.

In addition, due to the fact that the two connector elements are maintained in a perfectly pre-determined position, by being strictly parallel to one another, it is possible to arrange the contacts, particularly as regards their length, so that certain connections are established in the first place (on connection) or broken in the second place (on disconnection), in order, for example, to ensure the preservation of memorized data.

In a particularly simple arrangement, the axis of rotation of the actuating lever projects into the housing in the form of a head which constitutes the guide member.

In a preferred embodiment, the part of the first trough portion which joins the second portion is enlarged so that, at the location where the two portions are joined, a fraction of the side wall of the second trough portion extends across the first trough portion so as to constitute a stop for the drive member, the latter being situated in the vicinity of the guide member.

Provision may be made for the second trough portion to be substantially perpendicular to the first trough portion.

To ensure the maintenance of the guide and drive means in one or the other of their final stable positions thereof, it is possible to arrange so that the elastic return means are associated with actuating lever to maintain the latter elastically in one or the other of their end positions thereof.

To ensure the protection of the apparatus and to prevent the insertion of foreign bodies into the housing in the absence of the cassette, a pivoting movable flap is provided at the entrance of the housing and the actuating lever and this flap are arranged so that, when no cassette is in place in the housing and the flap is in position of closing the housing, the actuating lever cannot be actuated.

In this case, it is desirable for the actuating lever to comprise a pivoting arm extending across a portion of the housing orifice when actuating lever in a position awaiting a cassette, and for the flap to include a cut-out portion mating the contour of said arm sufficiently closely to prevent any movement in rotation of said arm.

Advantageously, for the purpose of mechanically protecting the connector element borne by the cassette, a second movable flap is provided on the cassette to protect the corresponding connector element when the cassette is not in operational position in the housing of the apparatus and a control means is provided to cause the retraction or placing in position of the second flap respectively during the course of the movements of insertion of the cassette into the housing or extraction of the cassette from the housing.

In this case, it is advantageous for the second movable flap to be located at the free end of at least one arm, which is disposed laterally of the cassette and which is mounted, at its other end, on a rotary axle fast to the cassette. At least one edge of this aim has a profile which constitutes a cam surface, and at least one fixed pin projects from a lateral surface of the housing and is positioned so as to cooperate with said edge of the arm to move the latter in a suitable direction during the course of the movement of the cassette in the housing.

BRIEF DESCRIPTION OF THE DRAWINGS

The invention will be better understood on reading the detailed description which follows of a particular embodiment given purely by way of illustrative example. In this description, reference is made to the accompanying drawings in which.

DETAILED DESCRIPTION OF A PARTICULAR EMBODIMENT

Figure 2:
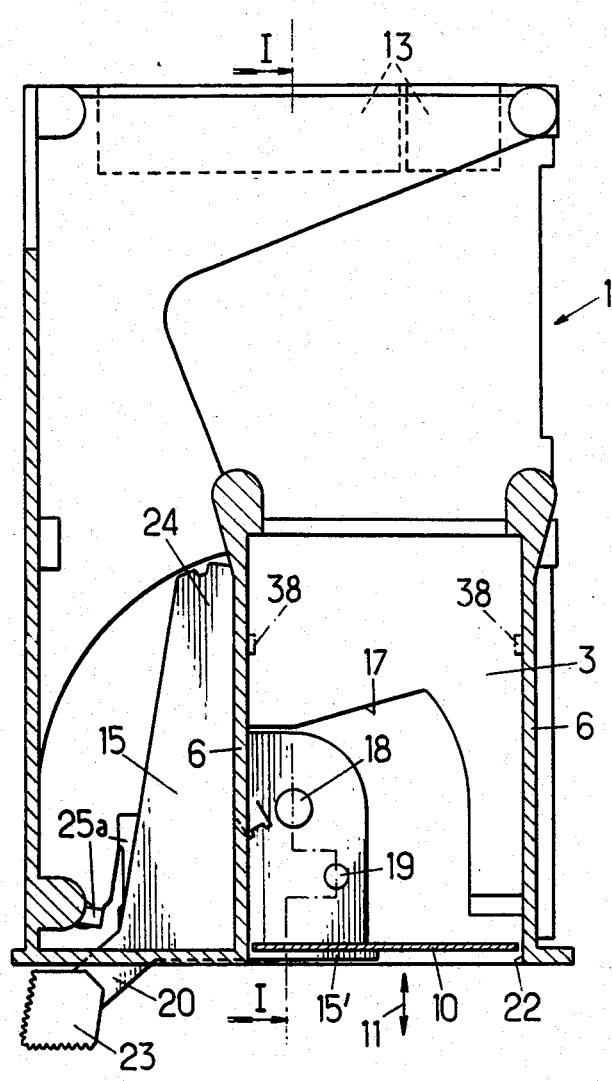
FIG. 2 is a view from above of the apparatus of FIG. 1 in section along the line II—II of FIG. 1.

The description which follows relates more specifically to a reading apparatus for bubble memories arranged in the form of removable cassettes as well as to cassettes of this type, since it is within the scope of this particular application that the features of the invention seem to have revealed themselves to be especially advantageous. However, it will be understood that the invention is not limited to this field of use alone and that it could be used in any similar cases.

Referring firstly to FIGS. 1 to 4, a reading apparatus 1 for a bubble memory arranged in a cassette 2 comprises a housing 3 adapted to receive a cassette and bounded by a bottom wall 4, a top wall 5 and two side walls 6; the back 7 is largely empty (or wide open) for the passage of a portion of a printed circuit plate 8 bearing a connector element 9, for example a connector element equipped with a plurality of female contacts of the socket type (not shown). Finally, towards the front, the housing 3 is closed by a flap 10 movable in rotation around a horizontal axle situated at the level of the upper edge of the flap, elastic return means being provided (not shown) to return the flap automatically into closed position shown in the figures.

The housing 3 is arranged to receive the removable cassette 2 which, for its insertion and its extraction, is moved rectilinearly along the double arrow 11.

The apparatus is completed, other than by the printed circuit plate 8, by a lower plate 12, bracing elements, side walls, one or several rear connectors 13 intended to ensure the electrical connections of the apparatus with neighboring members by simple plugging-in of the apparatus, and finally a front wall 14 (FIG. 4) onto which the housing 3 opens.

Generally, it suffices to know that the apparatus 1 is equipped with the components necessary particularly for the reading, and optionally writing, functions of the cassette 2.

An actuating lever 15 extends parallel to the bottom walls 4 on which it is pivotably mounted by means of an articulation axle 16. The lever is housed in an area 17 of discontinuity of the wall 4 so that upper surface of the lever is substantially in the plane of the surface of the wall 4. However, the axle 16 possesses a head 18 which projects inside the housing 3 as will be indicated below and which constitutes a guide member.

A drive member or pin 19, fixed to the lever 15, also projects inside the housing 3. The pin 19 is situated a little behind the head 18 of the axle 16 and slightly offset to the right (in FIG. 2) with respect to the head 18 (these positions having to be taken into consideration with respect to the direction of movement of the cassette 2 on its introduction into the housing 3).

The lever 15 possesses an extension 20 extending through a slot 21 of the front wall 14 which communicates with the front opening 22 of the housing 3, which extension is terminated by a grip knob 23.

On the opposite side, the lever 15 possesses an arm 24 arranged to cooperate, in an end position of the lever, with a microswitch 25a in order, for example, to then serve the function of supply or cutoff of certain electrical circuits.

Finally, a portion 15' of the lever 15 (for example the portion supporting the pin 19) extends over a portion of the base of the aperture of the housing 3. The lower edge of the flap 10 has a discontinuity 25 so as to mate as closely as possible the contour constituted by the portion 15° of the lever and the wall 4 (see FIG. 4). Due to this arrangement, when the flap 10 closes the housing 3 (absence of cassette), the discontinuity 25 of the flap constitutes a stop resisting the rotation (to the right in FIGS. 2 and 4) of the portion 15' of the lever 15 and hence the uncontrolled actuation of the lever 15. This safety means avoids accidental switching on or disconnecting of the components of the apparatus.

Figure 3:
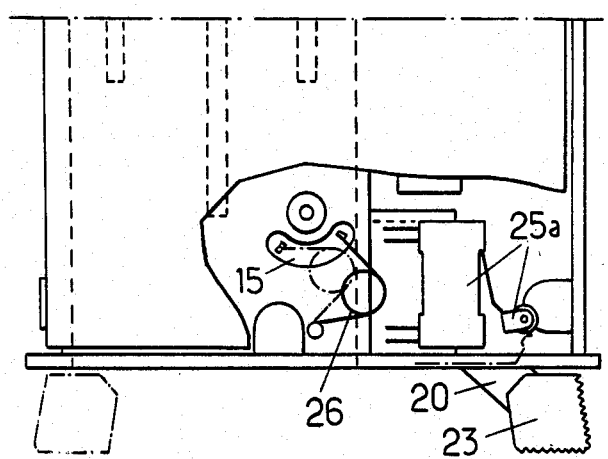
FIG. 3 is a view of a portion from below of the apparatus of FIG. 1 with part torn away.

As can be seen better in FIG. 3, a spring 26 is inserted between the lever 15 and a fixed point of the frame of the apparatus in order to push back the lever 15 elastically at the end of its travel both in its position awaiting a cassette (full line in FIGS. 1 to 4) and its position of locking a cassette in the housing 3 (in mixed line in FIG. 3).

Figure 1:
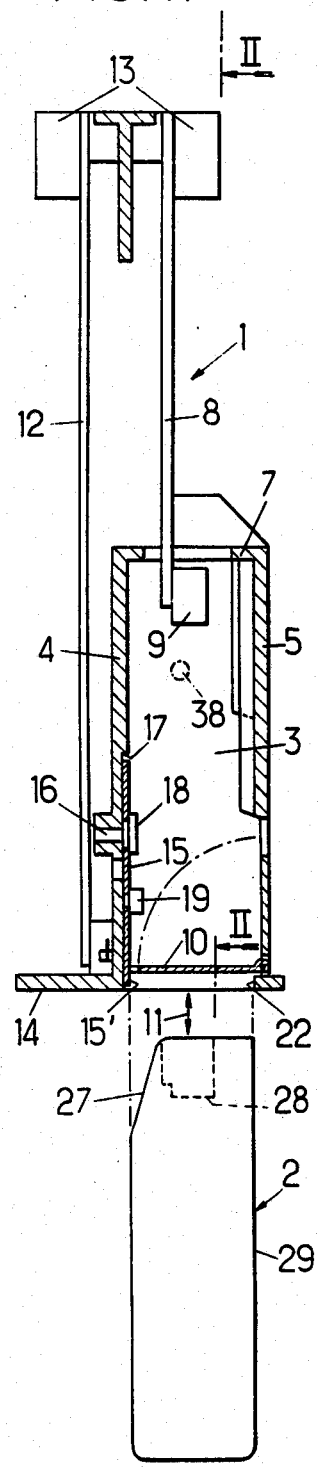
FIG. 1 is a side view, in vertical section, of an apparatus arranged according to the invention with a removable cassette presented opposite the housing.
Figure 5:
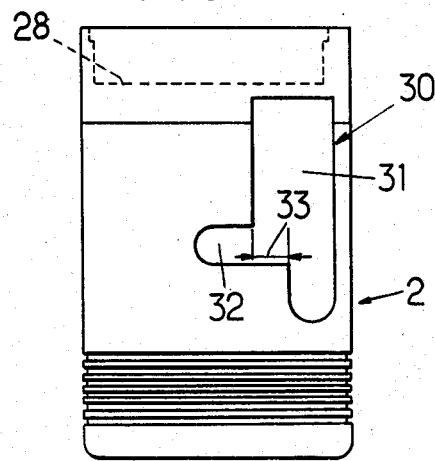
FIG. 5 is a view from below of the removable cassette shown in FIG. 1.

Referring now to FIGS. 1 and 5, the cassette 2 is in the general shape of a rectangular parallelepiped whose front portion 27 of the bottom surface is inclined to facilitate its insertion into the housing 3. In its outer shape, the cassette 2 satisfies the standards in force, i.e., is of a compatible shape which conforms to standards established throughout the industry. The cassette 2 is equipped, on its front surface, with a connector element 28, equipped with a plurality of male contacts, for example of the pin type, and adapted to cooperate with the connector element 9 of the apparatus 1.

In the upper surface 29 of the cassette 2 (see FIG. 5) is hollowed out a trough 30 comprising a first rectilinear trough portion 31 extending in the direction of movement of the cassette in the housing 3 and a second, transverse trough portion 32, also rectilinear, extending perpendicularly to the portion 31. The portion 31 of the trough opens on to the front edge of the cassette. The width of the trough portion 31 situated on this side of the portion 32 is substantially greater than the width of the trough portion 31 situated beyond the portion 32; these two widths correspond respectively to the total width (considered in the direction transverse to length of the cassette 11) of the mass or bulk of the head 18 and of the pin 19 taken together and to the diameter of the head 18 alone. The width of the transverse trough portion 32 corresponds substantially to the diameter of the pin 19. As a result of this arrangement a stop portion 33 is formed by a segment of that one of the edges of the transverse trough portion 32 disposed opposite the front surface of the cassette. This stop portion 33 is adapted to cooperate with the pin 19 to limit the insertion of the cassette on its introduction into the housing 3.

Figure 6:
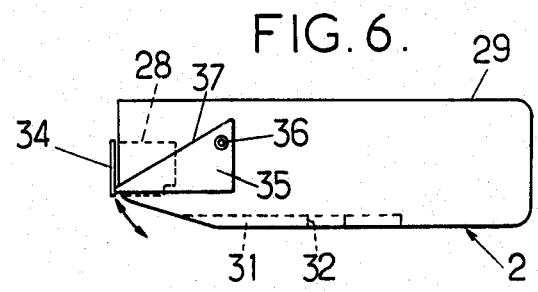
FIG. 6 is a view from the side of a modification of the cassette seen in FIG. 1, and FIGS. 7 to 10 are diagrams illustrating the mode of operation of a system according to the invention.

It may in addition be advantageous to protect the contacts of the connector element 28 borne by the cassette 2, both against impacts to avoid their mechanical damage and against the deposit of dirt to avoid poor electrical contacts subsequently on connection. There is hence provided, as shown in FIG. 6, a protector flap 34 extending in front of the entrance of the connector element 28 when the cassette 2 is not in position of use in the apparatus 1. This flap 34 is supported at the ends of two arms 35, extending on both sides of the lateral flanks of the cassette 2. These arms, which constitute a control means for flap 34, are articulated in rotation at their other ends on two pivoting axles 36 fixed to the sides of the cassette 2. The flap 34 and the two arms 35 hence form a U shaped part surrounding the cassette and adapted to pivot, for example, downwards. At least the upper longitudinal edge 37 of the arms 35 presents a portion inclined downwards and is thus of a profile which constitutes a cam surface, while two fingers 38 project laterally on the lateral walls of the housing 3 (see FIGS. 1 and 2) to cooperate with said edges 37 on insertion of the cassette. The length of the inclined portion of the lower edge of the arms 35 may be such that, in the course of insertion of the cassette into the housing 3, the flap 34 remains in closed position and only frees the entrance of the connector 28 in the course of the connection phase proper, which phases will be explained below. Elastic return means are provided (not shown) to return the arms 35 automatically into raised position as shown in FIG. 6.

The operation of the system which has just been described will now be indicated with reference to FIGS. 7 to 10 which illustrate successive steps. In these figures, only the head 18 of the pivot axle 16 of the lever and the pin 19 have been shown as regards the apparatus 1.

Before the insertion of the cassette, the apparatus 1 is in the state shown in FIGS. 1 to 4. The lever 15 is in the position shown with the grip knob 23 to the left and it is held in this position by the spring 26. In addition, the flap 10 being in the position of closing the access orifice 22 to the housing 3, the lever 15 is locked by this flap due to the abutment constituted by the discontinuity 25 and the lever 15 cannot be turned, which constitutes a safety feature avoiding the insertion of a cassette into the housing 3 when certain electrical circuits are not in the required situation (open or closed).

The presentation of a cassette 2 facing the orifice 22 is shown in FIG. 1 and diagrammatically in FIG. 7.

The introduction of the cassette into the housing 3 causes the flap 10 to spring upwards, which releases the lever 15 for its subsequent actuation. The rectilinear trough portion 31 cooperates through its two lateral edges with the head 18 and the pin 19, which ensures the guidance of the cassette in its rectilinear movement (arrow 11) in the housing 3 (FIG. 8), until the stop portion 33 comes into contact with the pin 19 (FIG. 9).

At this moment, the two connector elements 9 and 28 are presented one facing the other, but are not yet coupled and the continuation of the insertion movement of the cassette into the housing 3 is blocked. This step marks the end of the manual insertion process.

In the case where the cassette is of the type shown in FIG. 6, the fingers 38 have still not cooperated with the edge 37 of the arms 35 and the flap 34 is still in its position of closing the entrance of the connector element 28.

Figure 4:
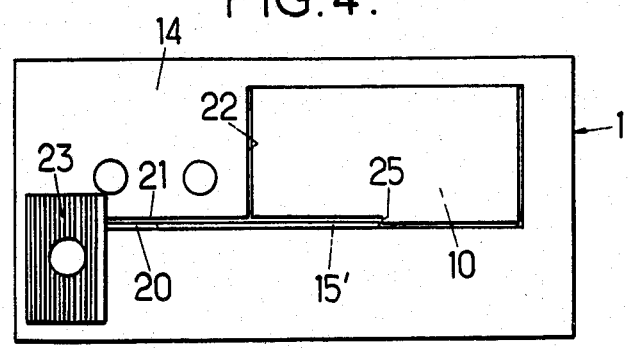
FIG. 4 is a front view of the apparatus of FIG. 1.

The operator then grips the knob 23 and moves it towards the right (in FIGS. 2 and 4). In the course of the rotation of the lever 15 which results therefrom, the pin 19 is moved in rotation, with a motion component which engages it in the transverse trough portion 32. Simultaneously, the pin 19 is actuated by a movement component directed parallel to the direction 11 and it cooperates with the edge of the transverse trough portion 32 to drive the cassette 2 and complete its insertion into the housing 3. The guidance of the cassette is then ensured only by the head 18 of the rotary axle supported against the edge of the trough portion 31.

In the case where the cassette is of the type shown FIG. 6, the fingers 38 and the inclination of the edges 37 of the arms 35 are such that, from the initiation of the movement of the cassette under the driving action of the pin 19, the edges 37 come into contact with the fingers 38 and the arms 35 are pushed back downwards, the flap 34 disengaging the entrance of the connector element 28. In order that this disengagement may be ensured before the cooperation of the connector elements 9 and 28, it is necessary, with arms 35 of relatively short length, for the inclination of the edges 37 to be relatively large, for example of the order of 30°.

When the lever 15 arrives at the end of its rotary travel, its arm 24 is in position to cooperate with the actuating rod of the microswitch 25a so as to ensure, at this moment only, certain electrical connections with the cassette.

The extraction of the cassette is effected by a reverse sequence of operations, by pushing the knob 23 from right to left (in FIGS. 2 and 4) to release the cassette, then by extracting the latter manually from the housing.

The connection and disconnection of the cassette by means of mechanical guide and drive means, as has just been explained, offers the advantage of pre-determined mutual maintenance in position (namely parallel to one another) of the two connector elements 9 and 28. Moreover, the actuating lever 15 acts as a force amplifier which enables the connectional disconnection of a relatively large number of contacts without the operator having, himself, to exert excessive force. As a result any necessity for relative twisting movements between the two connector elements is avoided which thus ensures adequate operating conditions to increase the lifespan of the connector elements.

As is self-evident and as emerges besides already from the foregoing, the invention is in no way limited to those of its types of application and embodiments which have been more especially envisaged; it encompasses, on the contary, all modifications.

In particular, it is possible to provide guide and drive means arranged to cause a movement of the cassette other than rectilinear.

We claim:

1. System constituted of an apparatus, particularly for reading and/or writing, and at least one removable cassette, particularly containing a memory, for such an apparatus, said apparatus comprising a housing for at least partially receiving the cassette and two electrical connector elements, including a plurality of cooperating contacts, provided respectively on the apparatus and on the cassette and being of pin and socket type respectively, said system comprising: (a) guide and drive means for guiding and driving the cassette in said housing, said guide and drive means comprising a trough provided on one surface of the cassette, said trough comprising a first, rectilinear trough portion extending in a direction of movement of the cassette and a second trough portion opening into said rectilinear portion and extending in the direction at an angle with respect to the latter, said guide means further comprising a guide member and a drive member, projecting inside the housing, for cooperating respectively with said first and second trough portions, said guide and drive means being adapted to occupy at least a first, guide position in which the cassette can, without risk of jamming against the walls of the housing, be inserted partially into the housing or extracted from said housing when the cassette is only already partially withdrawn therefrom and in which the two connector elements are not then respectively again or any longer in cooperation, and a second, locking position in which the cassette is inserted and locked in the housing in an operational position with the two connector elements coupled to one another, and (b) a single actuating lever supporting said drive member and including one end which is actuable from outside the apparatus, said lever extending partly into the housing and being movable in rotation, in a plane parallel to the surface of the housing bearing the said drive member and said guide member, around a fixed axis of rotation to cause the guide and drive means to move between the first and the second positions thereof, said drive member being affixed to said actuating lever so as to possess a component of movement at least in the direction of rectilinear movement of the cassette, due to which component of movement the movement of the cassette is effected in a rectilinear path such that the two connector elements are separated or brought together while being held in a definite relative position, parallel to one another without the possibility of being mutually skewed.

2. System according to claim 1, wherein the axis of rotation of the lever is provided by a head which projects into the housing and which constitutes the guide member.

3. System according to claim 1, wherein the part of the first trough portion which joins the second trough portion is widened so that at the location where the two trough portions are joined a fraction of the side wall of the second trough portion extends across the first trough portion so as to constitute a stop for the drive member, and wherein the drive member is situated in the vicinity of the guide member.

4. System according to claim 1, wherein the second trough portion is substantially perpendicular to the first trough portion.

5. System according to claim 1, further comprising elastic return means, associated with said actuating lever, for maintaining the latter elastically in one or other of the end positions thereof.

6. System according to claim 1, wherein a pivoting flap is provided at the entrance of the housing and wherein the actuating lever and said flap are arranged so that, when no cassette is in place in the housing and the flap is in a position closing the entrance of the housing, the actuating lever cannot be actuated.

7. System according to claim 6, wherein the control lever includes a pivoting arm extending through a portion of the orifice of the housing when said actuating lever is in a cassette-awaiting position and wherein the flap includes a cut-out portion mating the contour of said arm sufficiently closely to prevent any rotational movement of said pivoting arm.

8. System according to claim 1, wherein a second movable flap is provided on the cassette to protect the corresponding connector element when the cassette is not in the operating position thereof in the housing and wherein a second control means is provided to cause the retraction, or the placing in position of said second flap, respectively, in the course of the movements of inserting the cassette into the housing or of extraction of the cassette from the housing.

9. System according to claim 8, wherein the second movable flap is disposed at the free end of at least one arm, said arm being disposed laterally of the cassette and mounted, at the other end thereof, on a rotary axle affixed to the cassette, said arm having at least one edge of a profile which constitutes a cam surface and wherein at least one fixed pin projects from a lateral surface of the housing and is positioned so as to cooperate with said edge of the arm to move the latter in a suitable direction during the course of the movement of the cassette in the housing.

* * * * *